United States Patent
Han et al.

(10) Patent No.: US 10,090,269 B2
(45) Date of Patent: Oct. 2, 2018

(54) BUMP STRUCTURE, DISPLAY DEVICE INCLUDING A BUMP STRUCTURE, AND METHOD OF MANUFACTURING A BUMP STRUCTURE

(71) Applicant: SAMSUNG DISPLAY CO., LTD., Yongin-si, Gyeonggi-Do (KR)

(72) Inventors: Ho-Seok Han, Cheonan-si (KR); Nam-Hee Park, Cheonan-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/407,902

(22) Filed: Jan. 17, 2017

(65) Prior Publication Data

US 2017/0243843 A1 Aug. 24, 2017

(30) Foreign Application Priority Data

Feb. 22, 2016 (KR) .................. 10-2016-0020601

(51) Int. Cl.
*H01L 23/544* (2006.01)
*H01L 23/00* (2006.01)

(52) U.S. Cl.
CPC .............. *H01L 24/13* (2013.01); *H01L 24/11* (2013.01); *H01L 24/16* (2013.01); *H01L 23/544* (2013.01); *H01L 2223/54426* (2013.01); *H01L 2224/0345* (2013.01); *H01L 2224/0401* (2013.01); *H01L 2224/05147* (2013.01); *H01L 2224/05166* (2013.01); *H01L 2224/1162* (2013.01); *H01L 2224/13076* (2013.01); *H01L 2224/13082* (2013.01); *H01L 2224/13083* (2013.01); *H01L 2224/13118* (2013.01); *H01L 2224/13144* (2013.01); *H01L 2224/13147* (2013.01); *H01L 2224/13155* (2013.01); *H01L 2224/16145* (2013.01); *H01L 2924/13069* (2013.01); *H01L 2924/1426* (2013.01)

(58) Field of Classification Search
CPC ........... H01L 24/13; H01L 24/11; H01L 24/16
See application file for complete search history.

(56) References Cited

U.S. PATENT DOCUMENTS

| | | | |
|---|---|---|---|
| 6,720,257 B1 * | 4/2004 | Zakel | H01L 24/11 257/E21.508 |
| 2008/0012128 A1 * | 1/2008 | Makino | H01L 24/03 257/737 |

FOREIGN PATENT DOCUMENTS

| | | |
|---|---|---|
| KR | 10-2009-0057894 | 5/2009 |
| KR | 10-2011-0047127 | 5/2011 |

* cited by examiner

*Primary Examiner* — Matthew Reames
(74) *Attorney, Agent, or Firm* — F. Chau & Associates, LLC

(57) ABSTRACT

A bump structure includes a first bump disposed on a substrate, the first bump including a first metal, at least one antioxidant member surrounded by the first bump, the at least one antioxidant member including a second metal having an ionization tendency greater than an ionization tendency of the first metal, and a second bump disposed on the first bump and the at least one antioxidant member.

20 Claims, 12 Drawing Sheets

US 10,090,269 B2

BUMP STRUCTURE, DISPLAY DEVICE INCLUDING A BUMP STRUCTURE, AND METHOD OF MANUFACTURING A BUMP STRUCTURE

CROSS-REFERENCE TO RELATED APPLICATION(S)

This application claims priority under 35 U.S.C. § 119 to Korean Patent Application No. 10-2016-0020601, filed on Feb. 22, 2016, in the Korean Intellectual Property Office (KIPO), the disclosure of which is incorporated by reference herein in its entirety.

TECHNICAL FIELD

The present invention relates to bump structures. More particularly, the present invention relates to bump structures electrically connecting a driver integrated circuit to a display panel, a display device including the bump structures, and methods of manufacturing the bump structures.

DISCUSSION OF THE RELATED ART

Flat panel display devices are widely used. A flat panel display device may be, for example, an organic light emitting display (OLED) device, a liquid crystal display (LCD) device, or the like. A flat panel display device may consume little power and display high definition images.

A flat panel display device includes a display panel. The display panel includes a plurality of pixels for displaying the images. In addition, the flat panel display device includes a driver chip for driving the pixels. Bump structures may be used to electrically connect the driver chip with the plurality of pixels.

The bump structures may include a conductive metal, and the conductive metal may be prone to oxidation. The metal oxide may increase the electrical resistance of the bump structures. Thus, the signals transmitted to the plurality of pixels through the bump structures may be delayed and a voltage drop may occur due to the increased resistance of the bump structures.

SUMMARY

The present invention relates to a bump structure including an antioxidant member for preventing or reducing oxidation of the bump structure, to a driver chip including the bump structure, and to a method of manufacturing the bump structure.

According to an exemplary embodiment of the present invention, a bump structure includes a first bump disposed on a substrate, the first bump including a first metal, at least one antioxidant member surrounded by the first bump, wherein the at least one antioxidant member includes a second metal having an ionization tendency greater than an ionization tendency of the first metal, and a second bump disposed on the first bump and the at least one antioxidant member.

According to an exemplary embodiment of the present invention, a display device includes a display panel and a driver chip electrically connected to the display panel. The driver chip includes a substrate including a driver integrated circuit, a wire, and an insulation layer covering the driver integrated circuit and the wire, and a bump structure including a first bump disposed on the wire, at least one antioxidant member surrounded by the first bump, and a second bump disposed on the first bump and the at least one antioxidant member. The first bump includes copper (Cu) and the at least one antioxidant member includes zinc (Zn). The at least one antioxidant member includes a bottom surface, a top surface, and a sidewall and the first bump surrounds the sidewall of the at least one antioxidant member.

According to an exemplary embodiment of the present invention, a method of manufacturing a bump structure includes forming a first bump on a substrate, wherein the first bump includes a first metal, forming at least one antioxidant member on the substrate, wherein the at least one antioxidant member extends at least partially inside of the first bump, wherein the at least one antioxidant member includes a second metal having an ionization tendency greater than an ionization tendency of the first metal, and forming a second bump on the first bump and the at least one antioxidant member.

BRIEF DESCRIPTION OF THE DRAWINGS

The present invention will be more clearly understood by describing in detail exemplary embodiments thereof in conjunction with the accompanying drawings, in which.

DETAILED DESCRIPTION OF THE EMBODIMENTS

Figure 1:
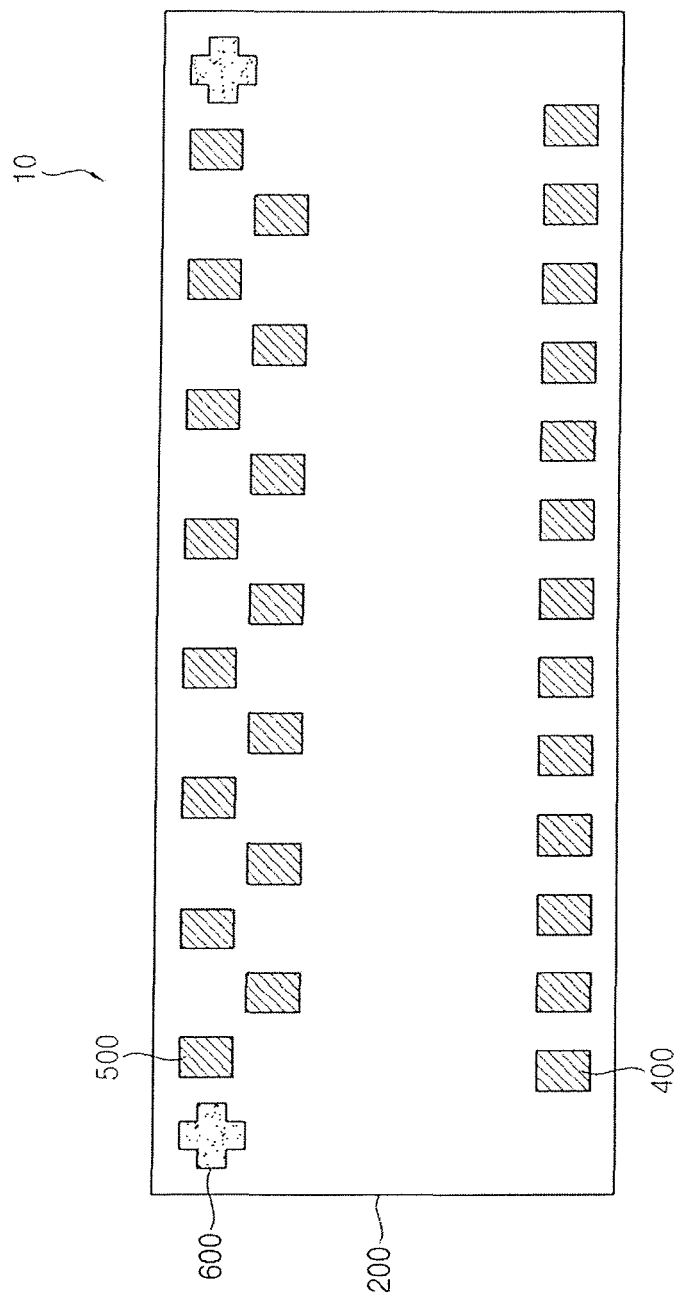
FIG. 1 is a plan view illustrating a driver chip according to an exemplary embodiment of the present invention.

Hereinafter, exemplary embodiments of the present invention will be described in detail with reference to the accompanying drawings. The proportions of elements illustrated in the drawings may be exaggerated for clarity. Like reference numerals may refer to like elements throughout the specification.

Figure 2:
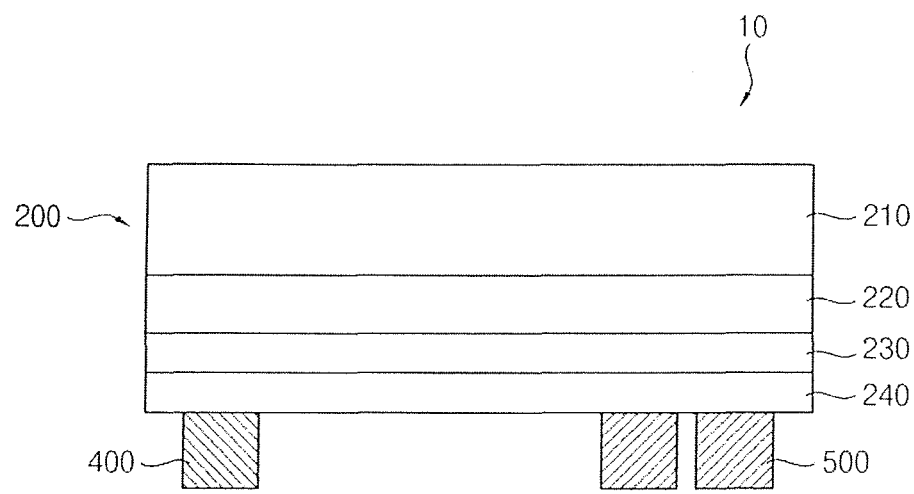
FIG. 2 is a side view illustrating the driver chip of FIG. 1, according to an exemplary embodiment of the present invention.

FIG. 1 is a plan view illustrating a driver chip according to an exemplary embodiment of the present invention. FIG. 2 is a side view illustrating the driver chip of FIG. 1, according to an exemplary embodiment of the present invention.

Referring to FIGS. 1 and 2, a driver chip 10 may include a substrate 200, a plurality of input bumps 400, a plurality of output bumps 500, etc. In an exemplary embodiment of the present invention, the driver chip 10 may further include at least one alignment mark 600.

The substrate 200 may include a base substrate 210, a driver integrated circuit 220, a plurality of wires 230, and an insulation layer 240 covering the driver integrated circuit 220 and the plurality of wires 230. The substrate 200 may have a shape that is, for example, substantially rectangular. For example, the substrate 200 may include two long sides and two short sides.

The driver integrated circuit 220 may generate signals for driving pixels of a display panel. When the driver chip 10 is electrically connected to the display panel, the signals generated by the driver chip 10 may be transmitted to the display panel to drive the pixels. The driver integrated circuit 220 may include a data driver integrated circuit, a scan driver integrated circuit and/or a timing controller integrated circuit. In other words, the driver chip 10 may include a data driver, a scan driver and/or a timing controller. The driver integrated circuit 220 may include, for example, a thin film transistor (TFT).

The wires 230 may electrically connect the driver integrated circuit 220 to the input bumps 400 and the output bumps 500. The insulation layer 240 may prevent physical damage to the driver integrated circuit 220 and the wires 230. In addition, the insulation layer 240 may prevent electrical malfunction of the driver integrated circuit 220 and the wires 230. In an exemplary embodiment of the present invention, the insulation layer 240 may include an insulation material. The insulation material may include, for example, silica, silicon nitride, an insulation resin, or the like.

The input bumps 400 may be disposed near a first long side of the substrate 200. In an exemplary embodiment of the present invention, as illustrated in FIG. 1, the input bumps 400 may be arranged in a row near the first long side of the substrate 200. However, the arrangement of the input bumps 400 is not limited thereto. For example, the input bumps 400 may be arranged in two or more rows on the substrate 200.

The input bumps 400 may receive electrical signals (e.g., a power voltage, a data signal, a clock signal or an image signal) from an external circuit. The driver integrated circuit 220 may receive the electrical signals through the input bumps 400.

The output bumps 500 may be disposed near a second long side of the substrate 200, which faces the first long side. In an exemplary embodiment of the present invention, as illustrated in FIG. 1, the output bumps 500 may be arranged in two rows near the second long side of the substrate 200. However, the arrangement of the output bumps 500 is not limited thereto. For example, the output bumps 500 may be arranged in one, three, or more than three rows on the substrate 200.

The output bumps 500 may output electrical signals (e.g., a data signal, a scan signal, a timing signal, etc.) through lines disposed on an external device (e.g., the display panel).

The alignment mark 600 may be disposed on the surface of the substrate 200 on which the bumps 400 and 500 are disposed. The alignment mark 600 may include a metal, however, the present invention is not limited thereto. For example, the alignment mark 600 may include various materials, the presence of which can be identified on the substrate 200. The alignment mark 600 may be disposed, for example, near an edge of the substrate 200. In addition, the alignment mark 600 may be disposed, for example, near a corner of the substrate 200.

The alignment mark 600 may be used as a point of reference for aligning the driver chip 10 on an electronic device when installing the driver chip 10 on the electronic device. The electronic device may be, for example, a display panel. For example, a chip mounting machine may detect the alignment mark 600 by using a camera, and may dispose the driver chip 10 at a particular location of the electronic device by using the alignment mark 600.

A structure of the input and output bumps 400 and 500 will be described in detail below.

Figure 3:
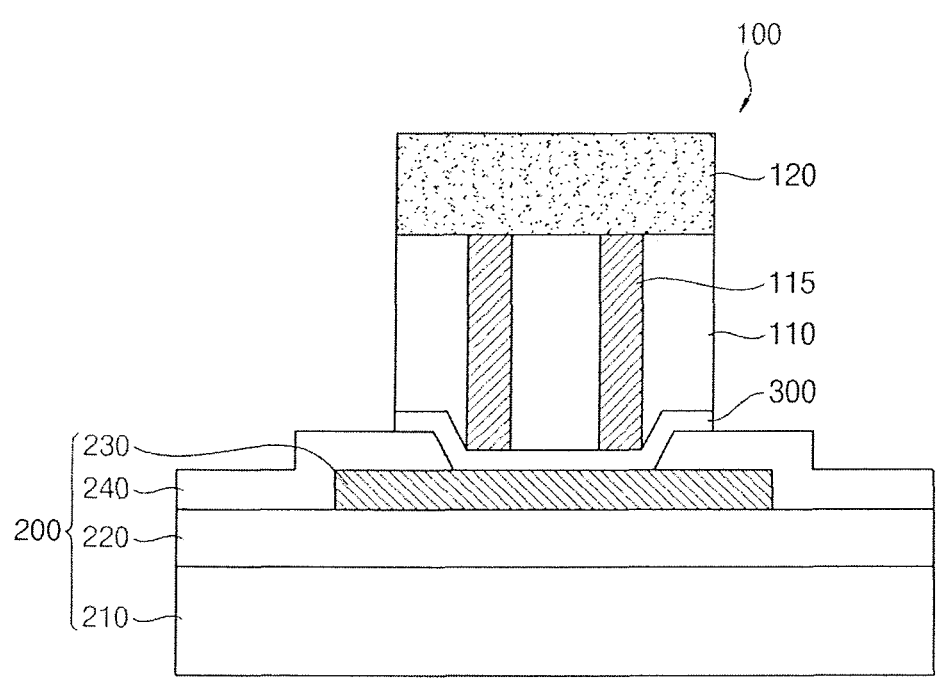
FIG. 3 is a cross-sectional view illustrating a bump structure according to an exemplary embodiment of the present invention.
Figure 4:
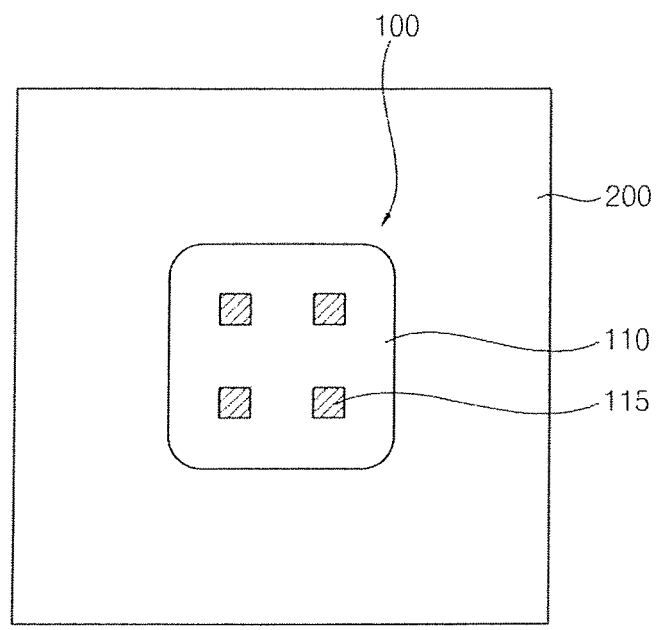
FIG. 4 is a plan view illustrating the bump structure of FIG. 3, according to an exemplary embodiment of the present invention.

FIG. 3 is a cross-sectional view illustrating a bump structure according to an exemplary embodiment of the present invention. FIG. 4 is a plan view illustrating the bump structure of FIG. 3, according to an exemplary embodiment of the present invention.

Referring to FIGS. 3 and 4, the driver chip 10 may include the substrate 200, an under bump metallurgy (UBM) 300 disposed on the substrate 200, and a bump structure 100 disposed on the UBM 300. The substrate 200 may include the base substrate 210, the driver integrated circuit 220, a wire 230, the insulation layer 240, etc.

The base substrate 210 may serve as a base member for a circuit that is formed thereon. The base substrate 210 may include, for example, silicon oxide, glass, and/or a transparent synthetic resin.

The driver integrated circuit 220 may be disposed on the base substrate 210, and the wire 230 may be disposed on the driver integrated circuit 220. The insulation layer 240 may be disposed on the driver integrated circuit 220 to cover a portion of the wire 230. The insulation layer 240 may have an opening to expose a portion of the wire 230.

The UBM 300 may be disposed on the exposed portion of the wire 230 and on a portion of the insulation layer 240. The UBM 300 may attach the bump structure 100 to the exposed portion of the wire 230. The UBM 300 may prevent the bump structure 100 from being diffused to the outside of the exposed portion of the wire 230, and may uniformly spread the bump structure 100 on a top surface of the exposed portion of the wire 230. For example, the UBM 300 may include titanium (Ti) and/or copper (Cu).

In an exemplary embodiment of the present invention, the bump structure 100 may include a first bump 110, an antioxidant member 115, and a second bump 120.

As illustrated in FIG. 3, the first bump 110 may be disposed on the UBM 300. The first bump 110 may include a metal. For example, the first bump 110 may include copper (Cu).

Copper may be oxidized when exposed to oxygen. When the first bump 110 includes copper, copper oxide may be formed on a surface of the first bump 110 when forming the first bump 110. In this case, the electrical resistance of the first bump 110 may increase by the copper oxide formed on the surface of the first bump 110.

At least one antioxidant member 115 may be disposed inside the first bump 110. The at least one antioxidant member 115 may be surrounded by the first bump 110. In other words, the first bump 110 may surround at least one antioxidant member 115. The antioxidant member 115 may include a metal having an ionization tendency greater than the ionization tendency of the metal included in the first bump 110. For example, the antioxidant member 115 may include zinc (Zn).

The ionization tendency of a metal is related to the reactivity of the metal. When a metal has a high ionization tendency, the metal has a high reactivity. A metal that has a high reactivity may easily lose electrons. In other words, a metal having a high ionization tendency may be easily oxidized. In an exemplary embodiment of the present invention, when a first metal (e.g., zinc) having an ionization tendency greater than the ionization tendency of a second metal (e.g., copper), is disposed inside or within the first bump 110 to contact the first bump 110, the second metal being included in the first bump 110, the first metal may easily lose electrons by combining with oxygen since the reactivity of the first metal is greater than that of the second metal. Accordingly, the first metal may be easily oxidized. Therefore, a metal oxide may not be formed on the surface of the first bump 110 or the formation of the metal oxide on the surface of the first bump 110 may be reduced. Thus, the electrical resistance of the first bump 110 may not increase or the electrical resistance of the first bump 110 may increase by a small amount.

In an exemplary embodiment of the present invention, the antioxidant member 115 may have a column shape such as a cylinder shape, a polyprism shape, or the like. For example, as illustrated in FIG. 3, the antioxidant member 115 may have a column shape extending from the UBM 300 to the second bump 120. In an embodiment, the antioxidant member 115 may have a bottom surface, a top surface, and a sidewall disposed therebetween. The first bump 110 may surround the sidewall of the antioxidant member 115. However, the shape of the antioxidant member 115 is not limited thereto, and the antioxidant member 115 may have various shapes to reduce the oxidation of the first bump 110.

At least one antioxidant member 115 may be disposed inside the first bump 110. For example, as illustrated in FIG. 4, four antioxidant members 115 may be disposed inside the first bump 110 in a matrix structure which includes rows and columns. However, the number and the arrangement of the antioxidant members 115 is not limited thereto. For example, one or more antioxidant members 115 may be disposed in the first bump 110 in various arrangements to reduce the oxidation of the first bump 110.

The second bump 120 may be disposed on the first bump 110. The second bump 120 may include a metal. For example, the second bump 120 may include gold (Au).

In an exemplary embodiment of the present invention, the antioxidant member 115 may be in contact with the second bump 120. For example, a top surface of the first bump 110 and a top surface of the antioxidant member 115 may be located at substantially the same level or plane. Therefore, when forming the first bump 110 and the antioxidant member 115, the oxidation of the first bump 110 may be further reduced.

Figure 5:
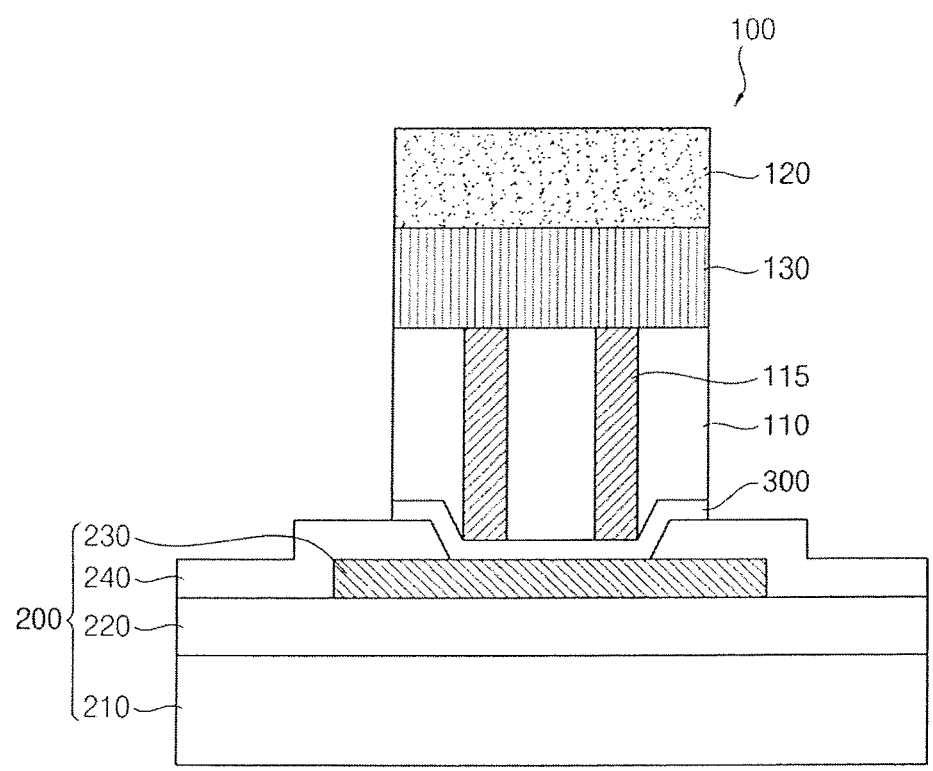
FIG. 5 is a cross-sectional view illustrating a bump structure according to an exemplary embodiment of the present invention.

FIG. 5 is a cross-sectional view illustrating a bump structure according to an exemplary embodiment of the present invention.

Referring to FIG. 5, a driver chip 10 may include a substrate 200, a UBM 300 disposed on the substrate 200, and a bump structure 100 disposed on the UBM 300. The substrate 200 may include a base substrate 210, a driver integrated circuit 220, a wire 230, and an insulation layer 240. The bump structure 100 may include a first bump 110, an antioxidant member 115, a second bump 120, and a third bump 130. Some elements of the bump structure 100 illustrated in FIG. 5 may be the same as or similar to the elements of the bump structure 100 described with reference to FIGS. 3 and 4.

In an exemplary embodiment of the present invention, the third bump 130 may be disposed between the first bump 110 and the second bump 120. The third bump 130 may include a metal. For example, the third bump 130 may include nickel (Ni).

When forming the bump structure 100, the first bump 110, the second bump 120, and the third bump 130 may be compressed by using, for example, a thermal compression process or method. When each of the first and second bumps 110 and 120 includes a metal (e.g., copper or gold) which is malleable or pliable, and when the third bump 130 includes a metal (e.g., nickel) which is stiff, rigid or inflexible, the third bump 130 may be disposed between the first bump 110 and the second bump 120 so that an adhesive strength between the bumps 110, 120 and 130 may increase.

In an exemplary embodiment of the present invention, the antioxidant member 115 may be in contact with the third bump 130. For example, a top surface of the first bump 110 and a top surface of the antioxidant member 115 may be located at substantially the same level or plane. Therefore, when forming the first bump 110 and the antioxidant member 115, the oxidation of the first bump 110 may be further reduced.

Figure 6:
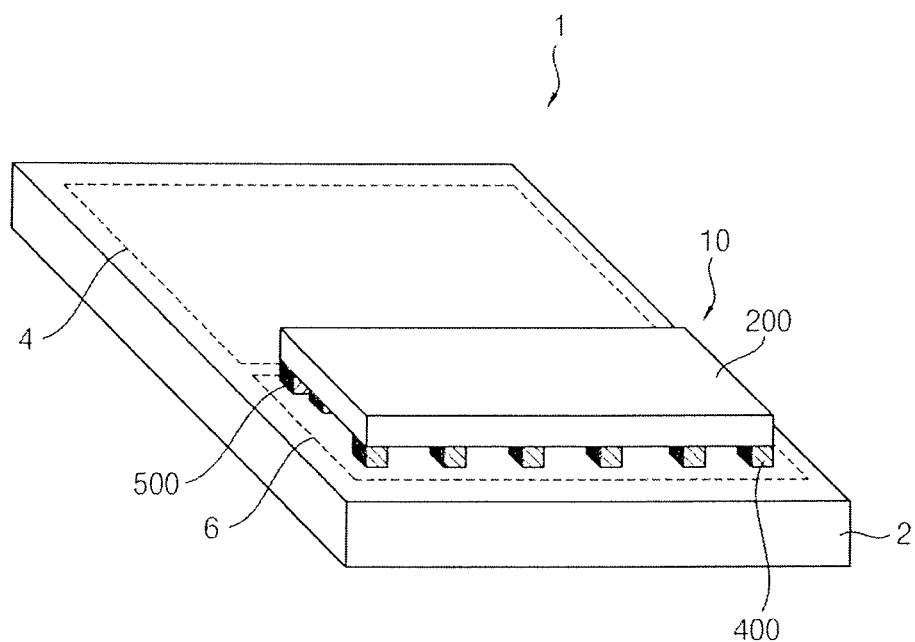
FIG. 6 is a perspective view illustrating a display device according to an exemplary embodiment of the present invention.
Figure 7:
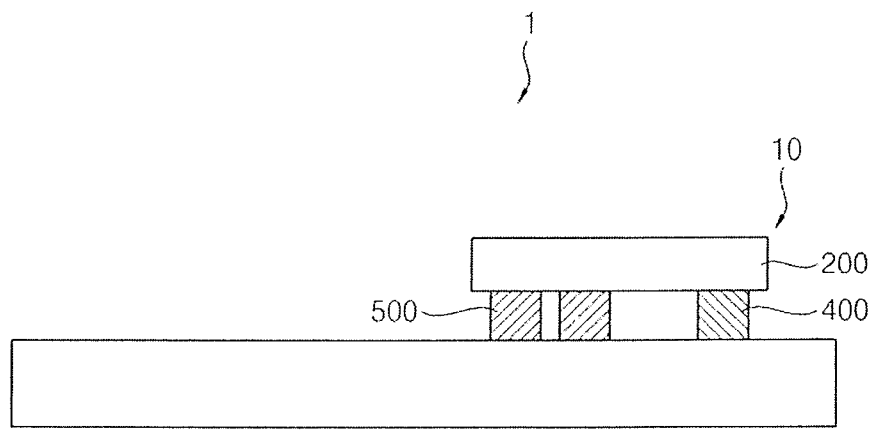
FIG. 7 is a side view illustrating the display device of FIG. 6, according to an exemplary embodiment of the present invention.

FIG. 6 is a perspective view illustrating a display device according to an exemplary embodiment of the present invention. FIG. 7 is a side view illustrating the display device of FIG. 6, according to an exemplary embodiment of the present invention.

Referring to FIGS. 6 and 7, a display device 1 may include a display panel 2 and a driver chip 10. For example, the display device 1 may be a flat panel display device such as an organic light emitting display device or a liquid crystal display device. However, the present invention is not limited thereto.

The display panel 2 may include a display region 4 and a mounting region 6. A plurality of pixels may be disposed in the display region 4, and light may be emitted from the plurality of pixels to display images. The driver chip 10 may be disposed in the mounting region 6. A chip-on-glass (COG) method for mounting the driver chip 10 on a glass substrate may be used as a method of mounting the driver chip 10. However the present invention is not limited thereto. The driver chip 10 may be electrically connected to the display panel 2 by using a chip-on-film (COF) method for mounting the driver chip 10 on a polyimide substrate or a chip-on-board (COB) method for bonding the driver chip 10 to a printed circuit board (PCB) with wires.

The driver chip 10 may convert and output signals to display images on the display region 4 of the display panel 2. A driver integrated circuit included in the driver chip 10 may include a data driver, a scan driver, a timing controller, etc.

The driver chip 10 may include a plurality of input bumps 400 and a plurality of output bumps 500 to electrically connect the driver integrated circuit, included in the driver chip 10, to the display panel 2. In addition, the plurality of input bumps 400 and the plurality of output bumps 500 may be used to increase the adhesion between the substrate 200 and the display panel 2.

The input bumps 400 may receive electrical signals (e.g., a power voltage, a data signal, a clock signal or an image signal) from an external circuit. The driver integrated circuit 220 may receive the electrical signals through the input bumps 400. The output bumps 500 may output electrical signals (e.g., a data signal, a scan signal, a timing signal, etc.) through lines disposed on an external device (e.g., the display panel).

According to an exemplary embodiment of the present invention, the bump structure 100, which may be included in each of the input bumps 400 and in each of the output bumps 500, may include the first bump 110, the second bump 120, and the antioxidant member 115 disposed inside the first bump 110. Accordingly, the electrical resistance of the bump structure 100 may not increase. Therefore, a signal delay and a voltage drop, resulting from the resistance of the first bump 110 due to the oxidation of the first bump 110, may be reduced or prevented.

FIGS. 8 through 19 are cross-sectional views illustrating a method of manufacturing a bump structure according to an exemplary embodiment of the present invention.

Figure 8:
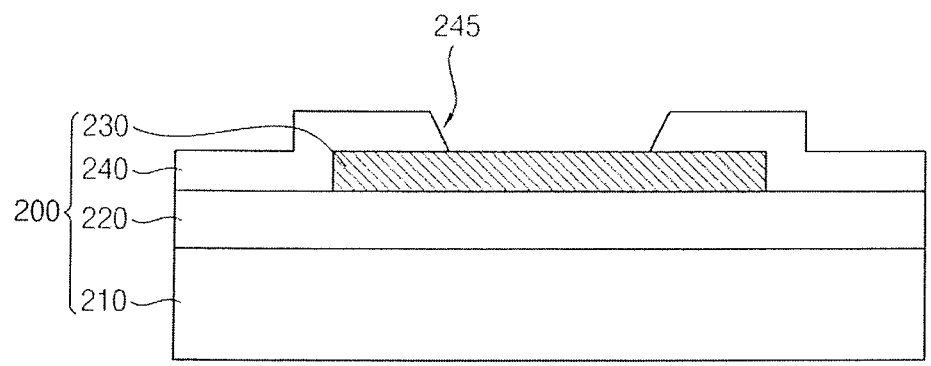
FIGS. 8 through 19 are cross-sectional views illustrating a method of manufacturing a bump structure according to an exemplary embodiment of the present invention.

Referring to FIG. 8, the substrate 200 may be provided. The driver integrated circuit 220 and the wire 230 may be sequentially formed by a semiconductor manufacturing method on the base substrate 210. The insulation layer 240 may be formed on the driver integrated circuit 220 to cover the wire 230 to protect the driver integrated circuit 220 and the wire 230 from electrical, physical, and/or chemical damages. In an exemplary embodiment of the present invention, the insulation layer 240 may be formed by a chemical vapor deposition (CVD) method, a plasma enhanced chemical vapor deposition (PECVD) method, an atomic layer deposition (ALD) method, a low pressure chemical vapor deposition (LPCVD), a sputtering method, etc. In an exemplary embodiment of the present invention, the insulation layer 240 may be formed by a spin coating method or a spray method using a polymer.

A portion of the insulation layer 240 may be removed, and the wire 230 may be exposed by an etching process using a mask. In an exemplary embodiment of the present invention, the insulation layer 240 may include a first opening 245 exposing the wire 230, and the insulation layer 240 may be partially etched to form the first opening 245. For example, the first opening 245 may be formed by the etching process using the mask on the location on which the bump structure may be disposed.

Figure 9:
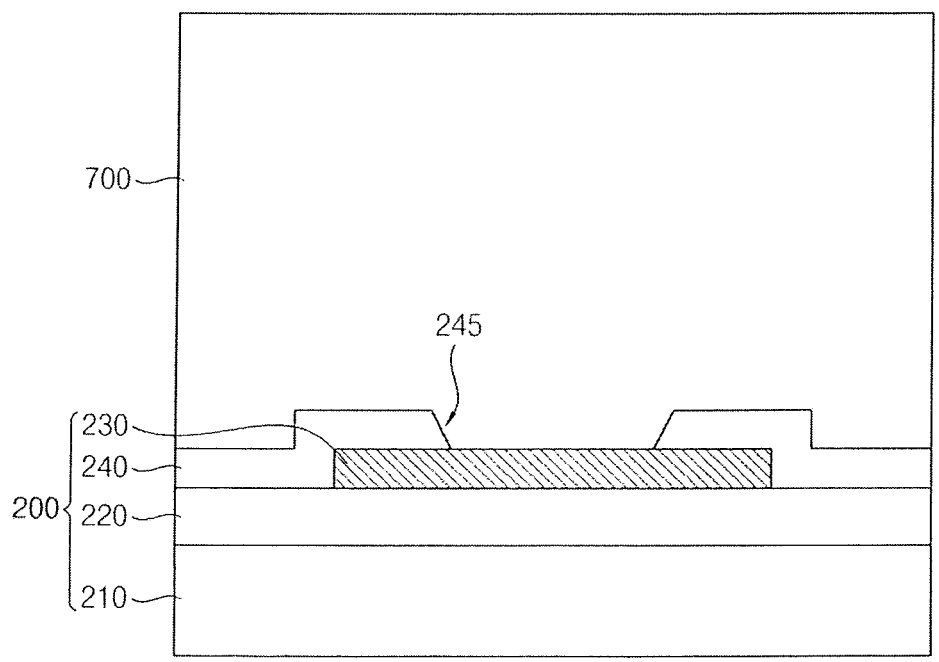

Referring to FIG. 9, a first photoresist layer 700 may be formed on the insulation layer 240. A thickness of the first photoresist layer 700 may determine a thickness of the bump structure 100. For example, the first photoresist layer 700 may have a thickness substantially the same as that of the bump structure 100. The thickness of the first photoresist layer 700 may be determined by considering a change of the bump structure 100, a process margin, etc., and the thickness of the bump structure 100.

Figure 10:
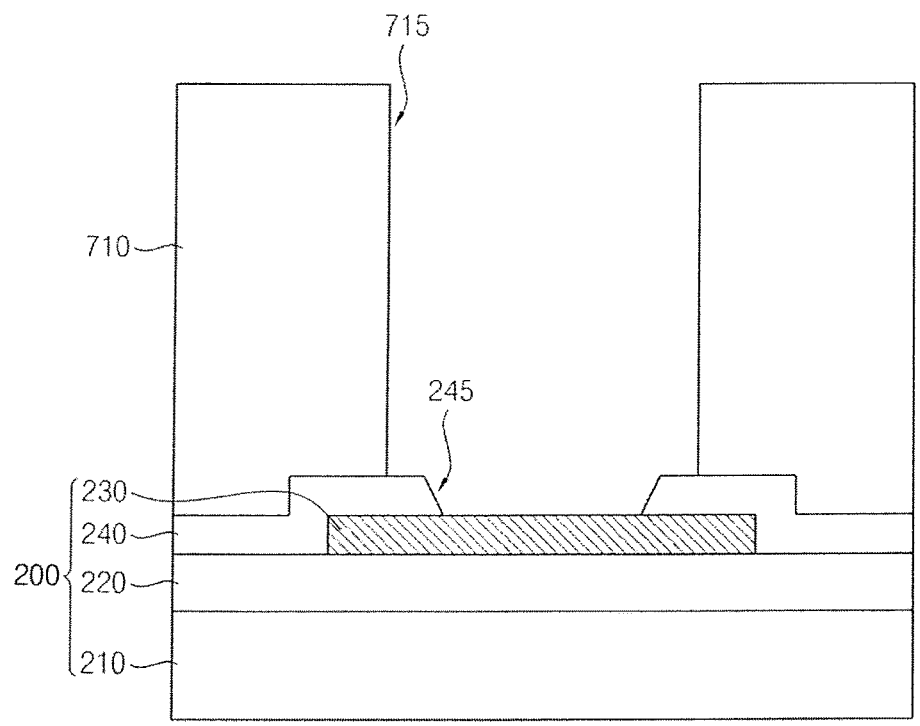

Referring to FIG. 10, an exposure process may be performed on the first photoresist layer 700 to form a first photoresist pattern 710. The first photoresist pattern 710 may include a second opening 715 exposing the wire 230. For example, a width of the second opening 715 may be greater than a width of the first opening 245. Therefore, the second opening 715 may expose a portion of the insulation layer 240 which covers the wire 230.

Figure 11:
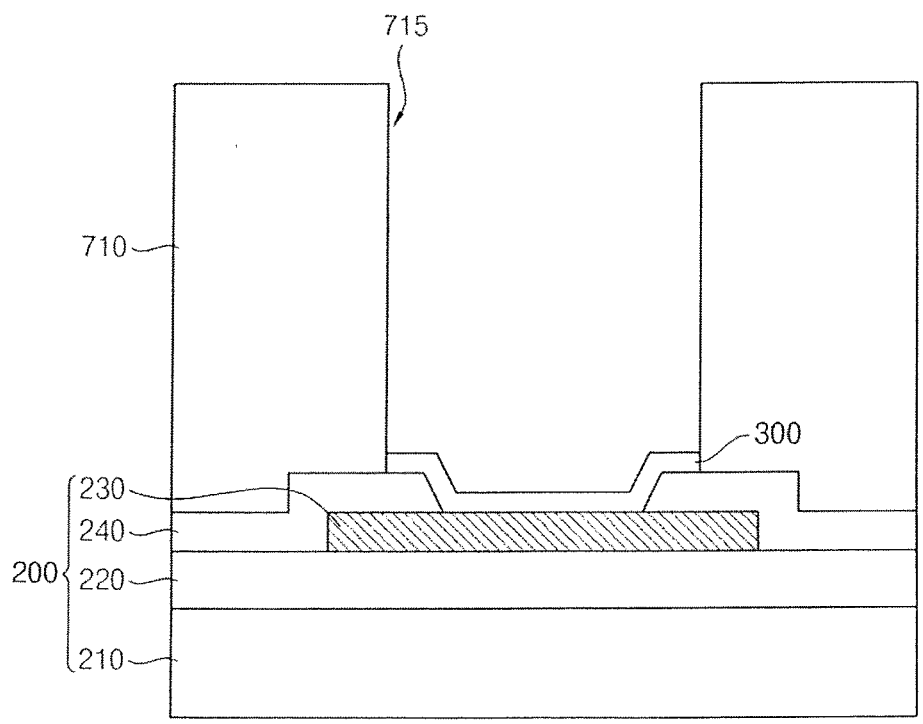

Referring to FIG. 11, a UBM 300 may be formed on an exposed portion of the wire 230 and the insulation layer 240. The UBM 300 may be formed along a surface profile of the exposed portion of the wire 230 and the insulation layer 240. For example, the UBM 300 may include titanium (Ti) and/or copper (Cu). The UBM 300 may be formed by using a sputtering process.

Figure 12:
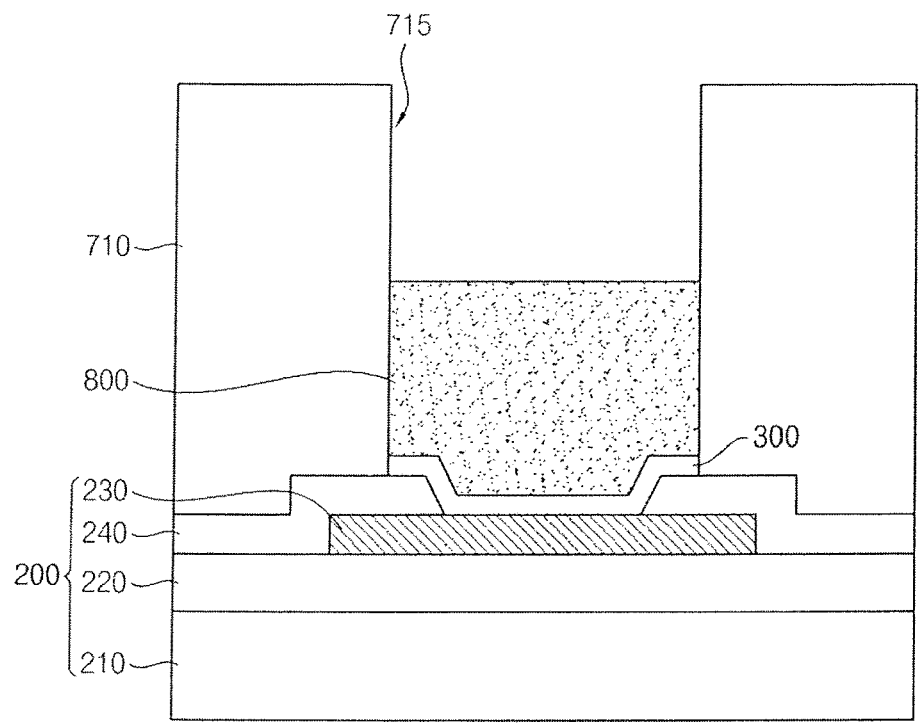

Referring to FIG. 12, a second photoresist layer 800 may be formed on the UBM 300. The second opening 715 may be filled with a photoresist to form the second photoresist layer 800. A thickness of the second photoresist layer 800 may determine a thickness of the antioxidant member 115, which will be formed in a subsequent process. For example, the second photoresist layer 800 may have a thickness substantially the same as the thickness of the antioxidant member 115.

Figure 13:
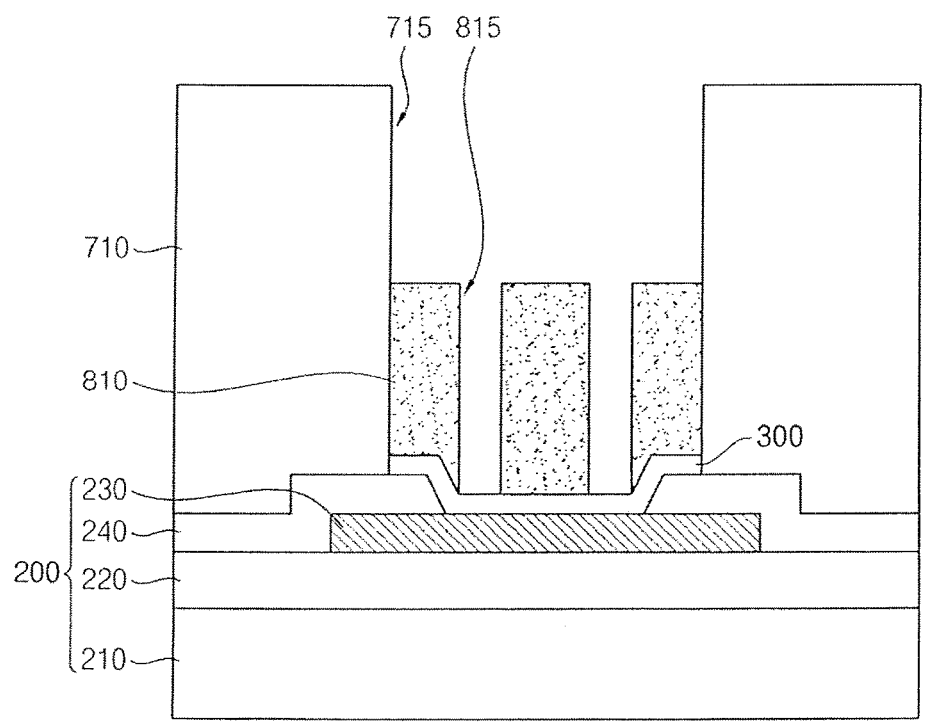

Referring to FIG. 13, an exposure process may be performed on the second photoresist layer 800 to form a second photoresist pattern 810. The second photoresist pattern 810 may include at least one third opening 815 exposing the UBM 300. A width of the third opening 815 may determine a width of the antioxidant member 115. For example, the third opening 815 may have a width substantially the same as the width of the antioxidant member 115.

Figure 14:
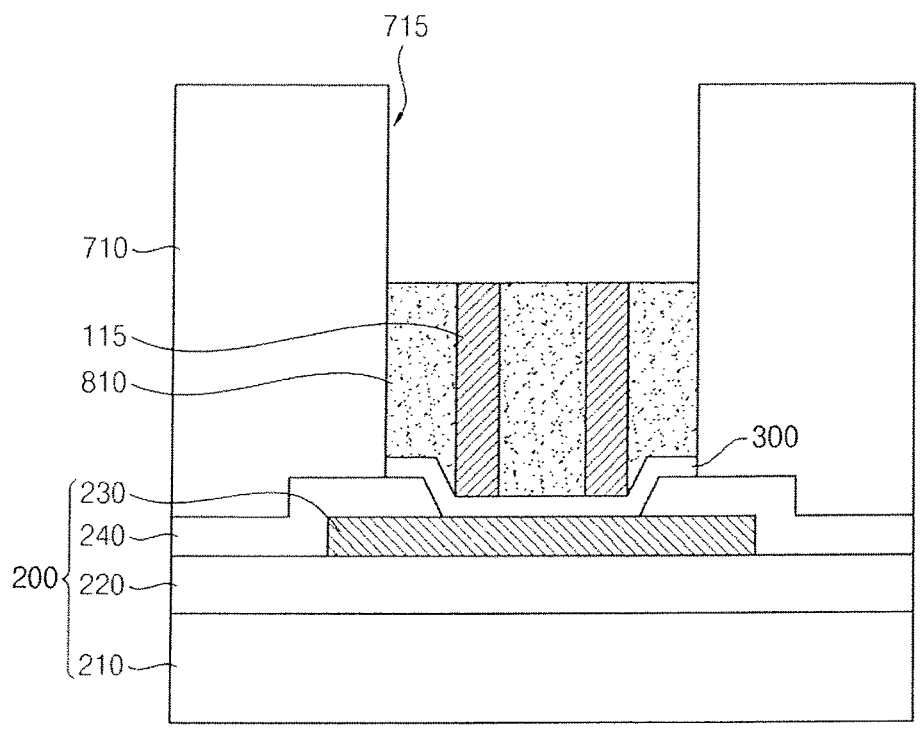

Referring to FIG. 14, the third opening 815 may be filled to form at least one antioxidant member 115. The antioxidant member 115 may be formed by filling a metal having an ionization tendency greater than the ionization tendency of a metal included in the first bump 110 in the third opening 815. For example, the antioxidant member 115 may be formed in the third opening 815 and the antioxidant member 115 may include zinc (Zn).

Figure 15:
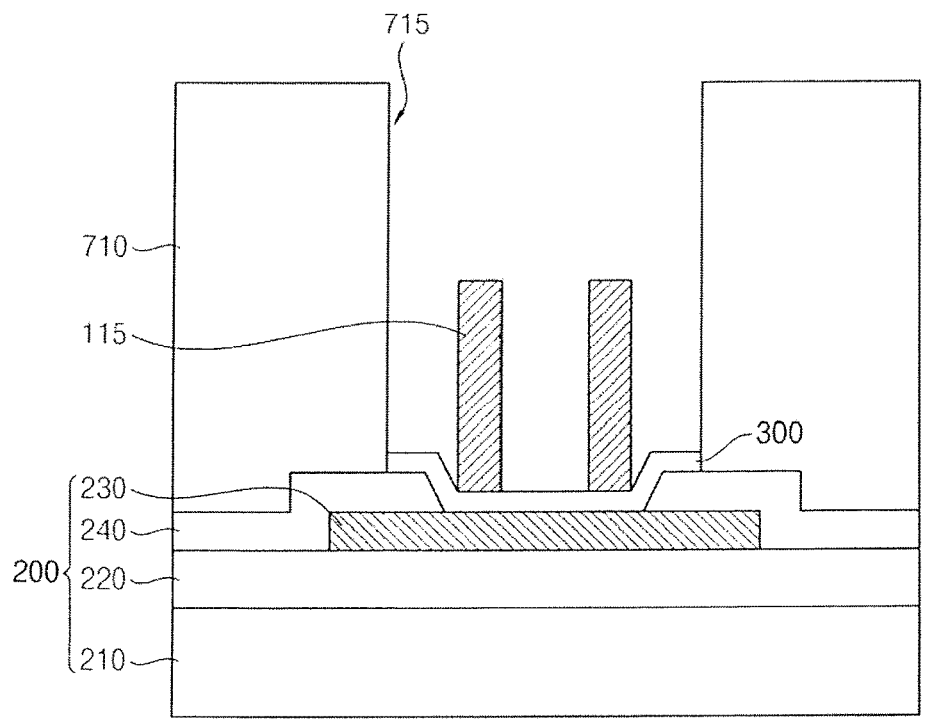

Referring to FIG. 15, the second photoresist pattern 810 may be removed. An ashing process and/or a stripping process may be performed to remove the second photoresist pattern 810.

Figure 16:
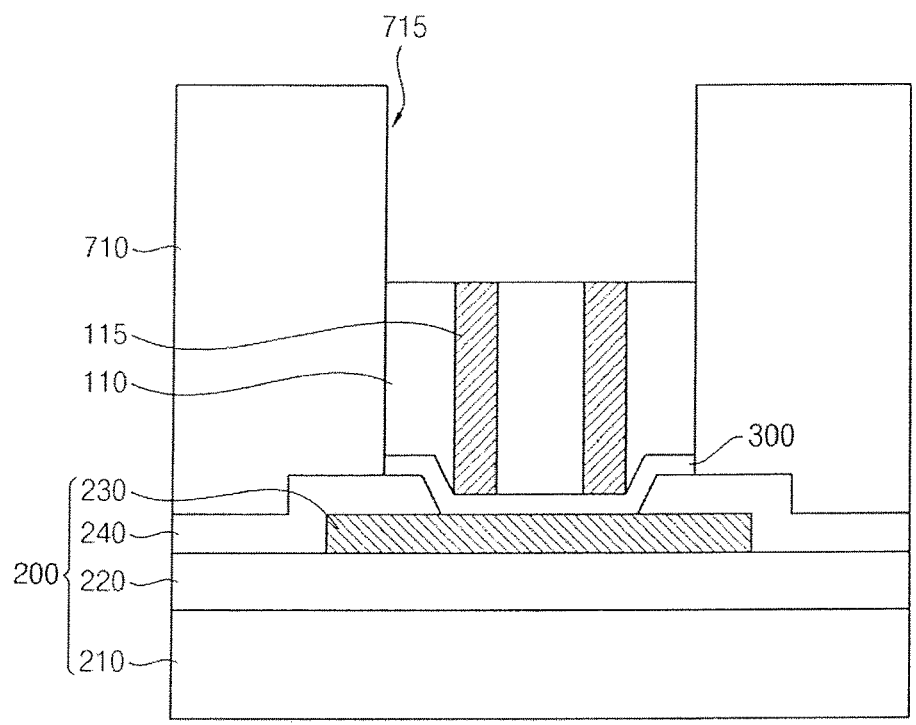

Referring to FIG. 16, the second opening 715 may be filled to form the first bump 110. The first bump 110 may include a metal. For example, the first bump 110 may include copper (Cu).

When the first bump 110 includes copper (Cu), copper oxide may be formed on a surface of the first bump 110 which is exposed to oxygen in the process of forming the first bump 110. In this case, electrical resistance of the first bump 110 may increase due to the copper oxide. However, as described above, when the antioxidant member 115 includes a metal having an ionization tendency greater than the ionization tendency of the metal included in the first bump 110, the formation of the metal oxide on the surface of the first bump 110 may be reduced or prevented. Accordingly, the electrical resistance of the first bump 110 may not increase or the electrical resistance of the first bump 110 may increase by a small amount.

In an exemplary embodiment of the present invention, a top surface of the first bump 110 and a top surface of the antioxidant member 115 may be located at substantially the same level or plane. Accordingly, since the top surface of the antioxidant member 115 may be exposed to oxygen in the process of forming the bump structure 100, oxidation of the first bump 110 may be further reduced.

Figure 17:
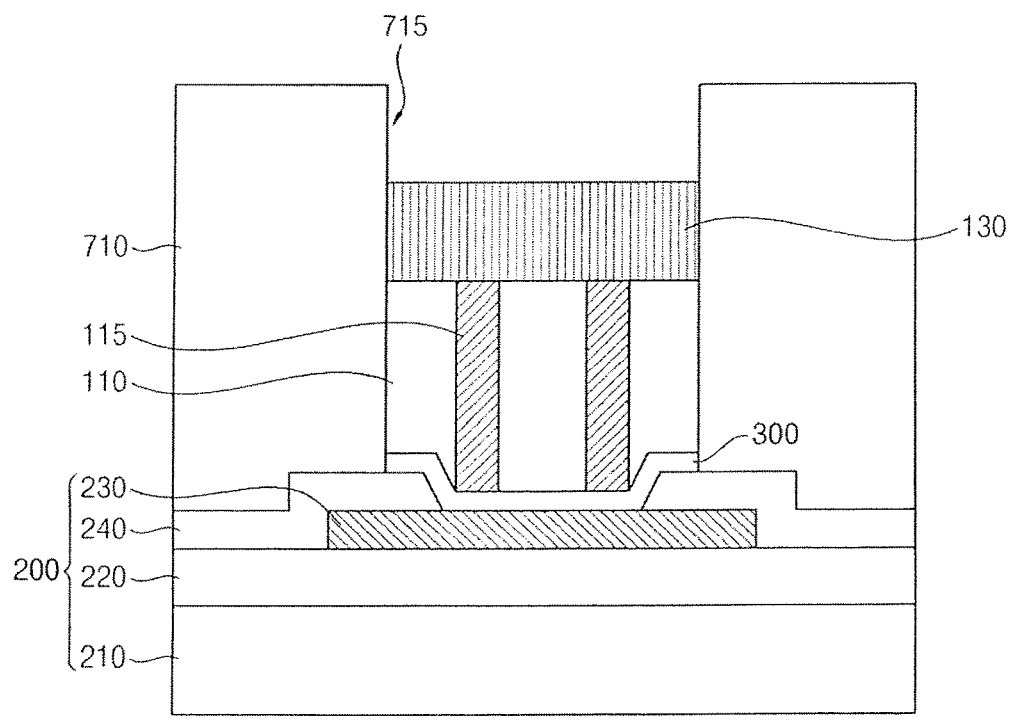

Referring to FIG. 17, the second opening 715 may be filled to form the third bump 130 on the first bump 110. The third bump 130 may include a metal. For example, the third bump 130 may include nickel (Ni). In an exemplary embodiment of the present invention, the process of forming the third bump 130 may be omitted.

In a process that may be performed after forming the second bump 120 on the third bump 130, the first bump 110, the second bump 120, and the third bump 130 may be compressed by using a thermal compression process, or the like. When each of the first and second bumps 110 and 120 includes a metal (e.g., copper or gold), which is malleable or pliable, the third bump 130 including a metal (e.g., nickel), which is stiff, rigid or inflexible, may be formed between the first bump 110 and the second bump 120. Accordingly, an adhesive strength between the bumps 110, 120 and 130, included in the bump structure 100, may be increased.

Figure 18:
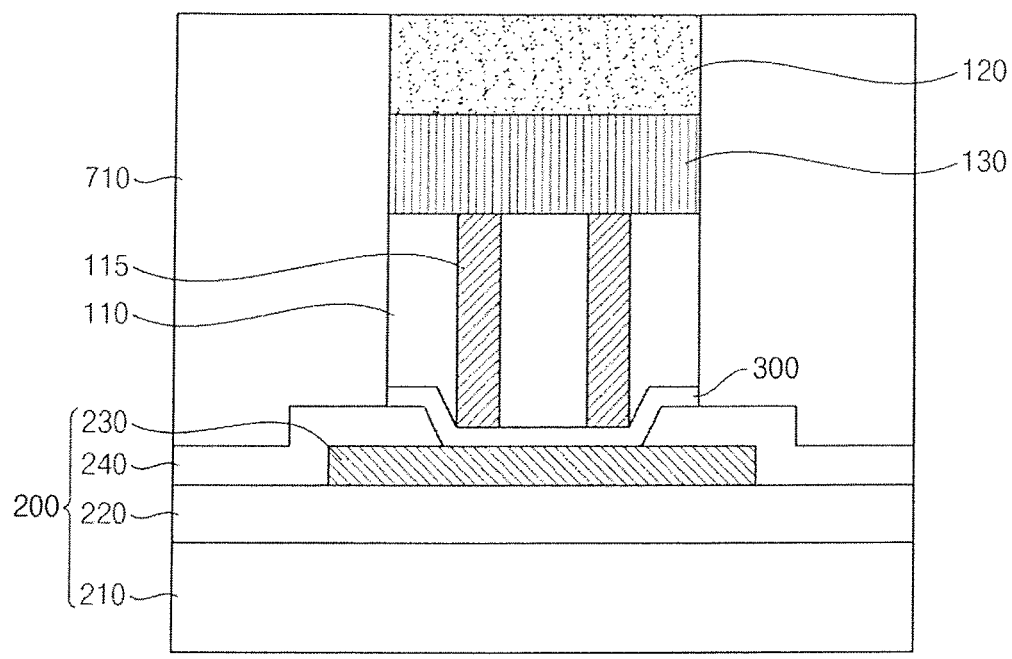

Referring to FIG. 18, the second opening 715 may be filled to form the second bump 120 on the third bump 130. The second bump 120 may include a metal. For example, the second bump 120 may include gold (Au). A top surface of the second bump 120 and a top surface of the first photoresist pattern 710 may be located at substantially the same level or plane.

Figure 19:
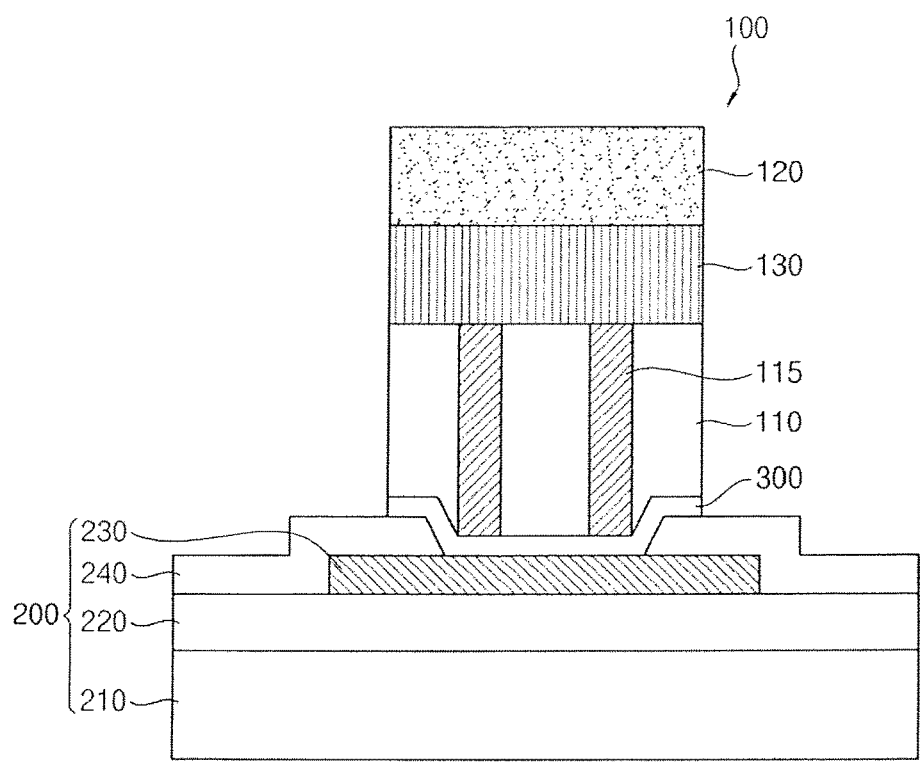

Referring to FIG. 19, the first photoresist pattern 710 may be removed. An ashing process and/or a stripping process may be performed to remove the first photoresist pattern 710. Accordingly, the bump structure 100 including the first bump 110, the antioxidant member 115, the second bump 120, and the third bump 130 may be formed.

Figure 20:
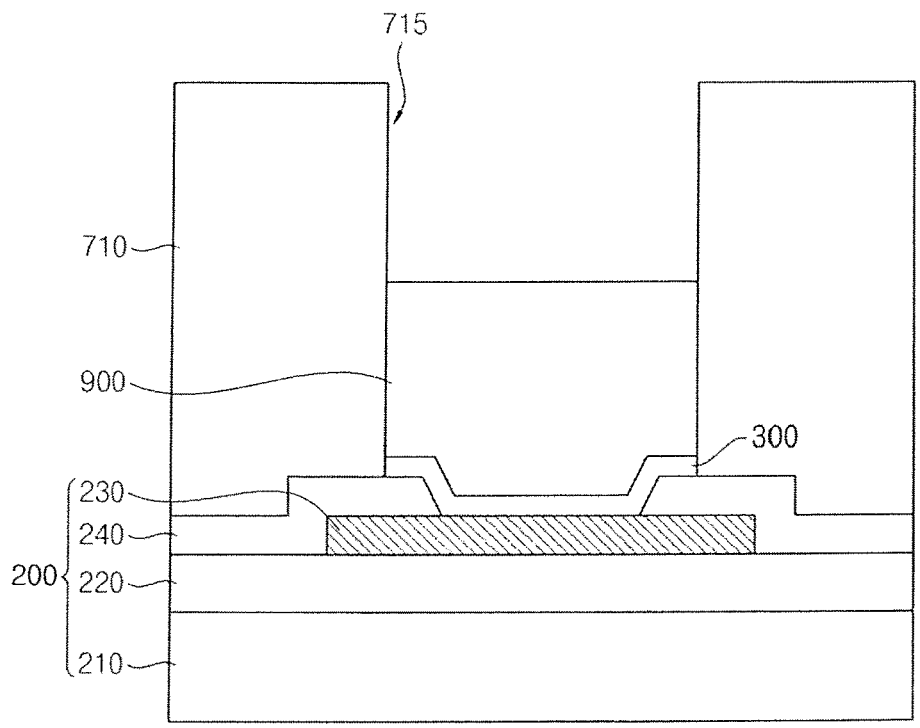
FIGS. 20 through 22 are cross-sectional views illustrating a method of manufacturing a bump structure according to an exemplary embodiment of the present invention.
Figure 21:
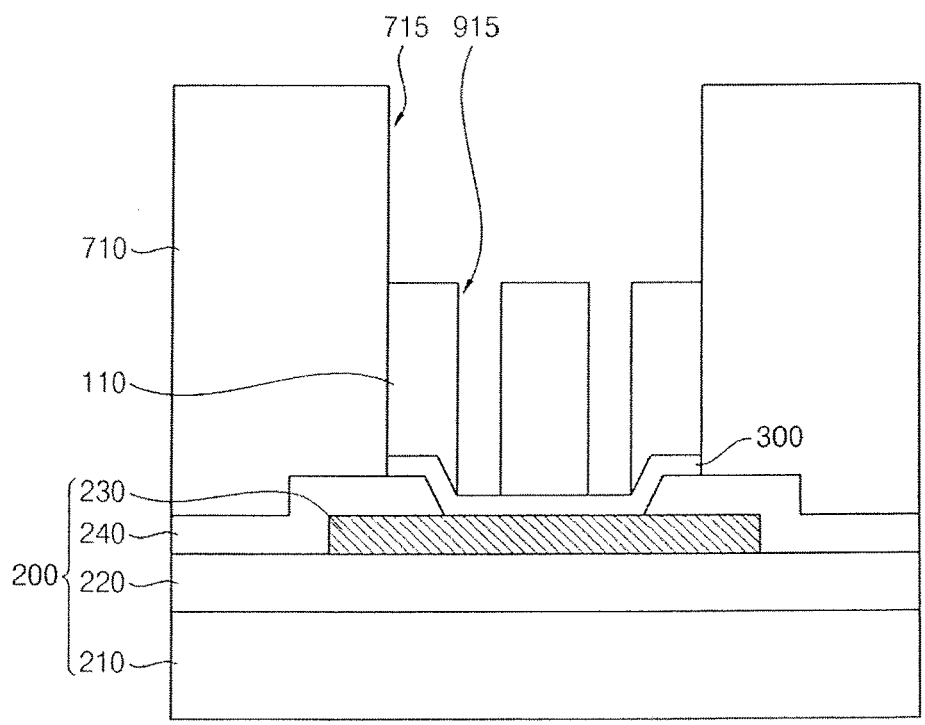
Figure 22:
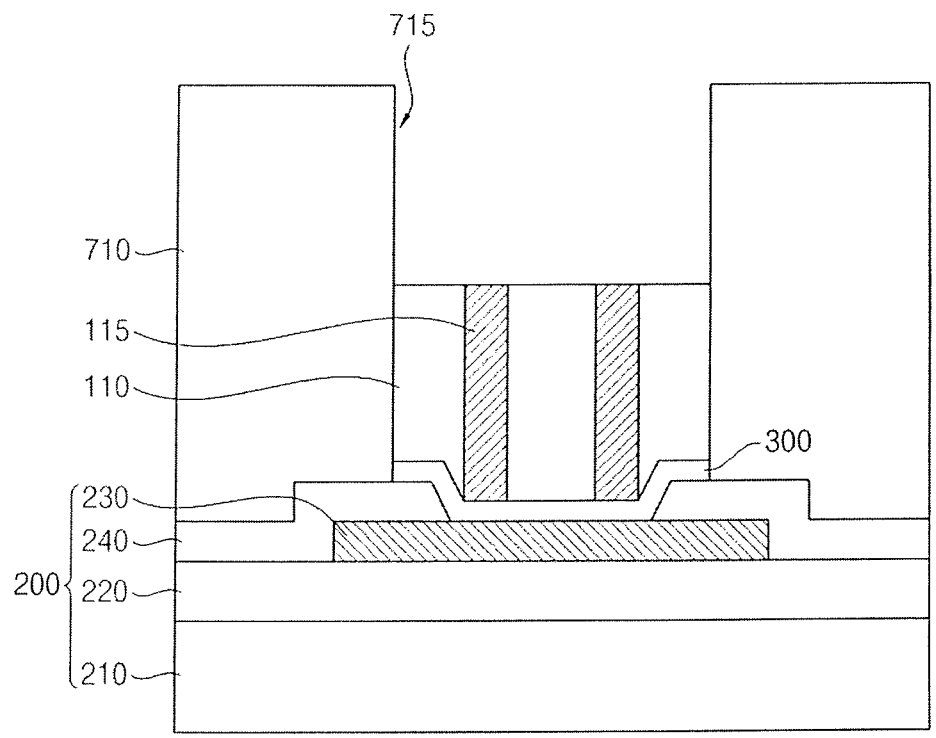

FIGS. 20 through 22 are cross-sectional views illustrating a method of manufacturing a bump structure according to an exemplary embodiment of the present invention.

The elements and/or operations described with reference to the method of FIGS. 8 through 19 may be applicable to the method of FIGS. 20 through 22.

Referring to FIG. 20, a preliminary bump 900 may be formed on the UBM 300. The second opening 715 may be filled with a metal to form the preliminary bump 900. For example, the preliminary bump 900 may include copper (Cu).

Referring to FIG. 21, the preliminary bump 900 may be patterned to form the first bump 110. An etching process may be performed to pattern the preliminary bump 900. The first bump 110 may include at least one fourth opening 915 exposing the UBM 300. A width of the fourth opening 915 may determine a width of the antioxidant member 115, which is to be formed in a subsequent process. For example, the fourth opening 915 may have a width substantially the same as that of the antioxidant member 115.

Referring to FIG. 22, the fourth opening 915 may be filled to form at least one antioxidant member 115. The antioxidant member 115 may include a metal having an ionization tendency greater than the ionization tendency of the metal included in the first bump 110. For example, the antioxidant member 115 may include zinc (Zn).

When the first bump 110 includes copper (Cu), copper oxide may be formed on a surface of the first bump 110 which is exposed to oxygen in the process of forming the first bump 110. In this case, the electrical resistance of the first bump 110 may increase due to the copper oxide. However, as described above, when the antioxidant member 115 includes metal having an ionization tendency greater than the ionization tendency of the metal included in the first bump 110, a metal oxide may not be formed on the surface of the first bump 110 or the formation of the metal oxide on the surface of the first bump 110 may be reduced. Thus, the electrical resistance of the first bump 110 may not increase or the electrical resistance of the first bump 110 may increase by a small amount.

In an exemplary embodiment of the present invention, a top surface of the first bump 110 and a top surface of the antioxidant member 115 may be located at substantially the same level or plane. Accordingly, since the top surface of the antioxidant member 115 may be exposed to oxygen in the process of forming the bump structure 100, oxidation of the first bump 110 may be further reduced.

The bump structures described above may be applied to various electronic devices. For example, the bump structures may be applied to computers, notebooks, mobile phones, smart phones, smart pads, portable media players (PMP), personal digital assistance (PDA), digital cameras, video camcorders, etc.

While the present invention has been particularly shown and described with reference to exemplary embodiments thereof, it will be apparent to those of ordinary skill in the art that various changes in form and detail may be made therein without departing from the spirit and scope of the present invention as defined by the following claims.

What is claimed is:

1. A bump structure, comprising:
a first bump disposed on a substrate, the first bump including a first metal, the first bump including at least one via-like opening disposed entirely therethrough;
at least one antioxidant member disposed within the first bump, and filling the at least one via-like opening, wherein the at least one antioxidant member includes a second metal having an ionization tendency greater than an ionization tendency of the first metal; and
a second bump disposed on the first bump and the at least one antioxidant member.

2. The bump structure of claim 1, wherein the first metal is copper (Cu) and the second metal is zinc (Zn).

3. The bump structure of claim 1, wherein the second bump includes gold (Au).

4. The bump structure of claim 1, wherein the first bump has a width substantially equal to a width of the second bump.

5. The bump structure of claim 4, wherein the first bump is in contact with the second bump for the entire width of the first bump and the entire width of the second bump.

6. The bump structure of claim 1, further comprising a third bump disposed between the first bump and the second bump.

7. The bump structure of claim 6, wherein the first metal is copper (Cu) and the second metal is zinc (Zn).

8. The bump structure of claim 6, wherein the second bump includes gold (Au).

9. The bump structure of claim 6, wherein the third bump includes nickel (Ni).

10. The bump structure of claim 6, wherein the antioxidant member is in contact with the third bump.

11. The bump structure of claim 10, wherein the first bump is in contact with the third bump.

12. A display device, comprising:
a display panel; and
a driver chip electrically connected to the display panel, wherein the driver chip comprises:
a substrate comprising a driver integrated circuit, a wire, and an insulation layer covering the driver integrated circuit and the wire; and
a bump structure comprising a first bump disposed on the wire, the first bump including at least one via-like opening disposed entirely therethrough, at least one antioxidant member disposed within the first bump and filling the at least one via-like opening, and a second bump disposed on the first bump and the at least one antioxidant member, wherein the first bump includes copper (Cu) and the at least one antioxidant member includes zinc (Zn), wherein the at least one antioxidant member comprises a bottom surface, a top surface, and a sidewall and the first bump surrounds the sidewall of the at least one antioxidant member.

13. The display device of claim 12, wherein the driver chip further comprises an under bump metallurgy (UBM) disposed between the wire and the first bump.

14. The display device of claim 13, wherein the UBM includes titanium (Ti) or copper (Cu).

15. A method of manufacturing a bump structure, comprising:

forming a first bump on a substrate, wherein the first bump includes a first metal;

forming at least one via-like opening through an entire width of the first bump;

forming at least one antioxidant member on the substrate, filing the at least one via-like opening, wherein the at least one antioxidant member is disposed within the first bump, wherein the at least one antioxidant member includes a second metal having an ionization tendency greater than an ionization tendency of the first metal; and forming a second bump on the first bump and the at least one antioxidant member.

16. The method of claim 15, wherein the formation of the first bump and the formation of the at least one antioxidant member comprises:

forming a first photoresist pattern including a first opening on the substrate;

forming a second photoresist pattern including at least one second opening disposed within the first opening;

filling the second opening to form the at least one antioxidant member;

removing the second photoresist pattern; and filling the first opening to form the first bump.

17. The method of claim 15, wherein the formation of the first bump and the formation of the at least one antioxidant member comprises:

forming a first photoresist pattern on the substrate, the first photoresist pattern including a first opening;

filling the first opening to form a preliminary bump;

patterning the preliminary bump to form the first bump, the patterned preliminary bump including at least one second opening; and filling the at least one second opening to form the at least one antioxidant member.

18. The method of claim 15, wherein the first metal is copper (Cu), the second metal is zinc (Zn) and the second bump includes gold (Au).

19. The method of claim 15, further comprising forming a third bump between the first bump and the second bump.

20. The method of claim 19, wherein the third bump includes nickel (Ni).

* * * * *